US012598929B2

(12) United States Patent　　　　(10) Patent No.:　US 12,598,929 B2
Fischer et al.　　　　　　　　　　　 (45) Date of Patent:　　　Apr. 7, 2026

(54) ATOMIC LAYER ETCHING OF MOLYBDENUM

(71) Applicant: Lam Research Corporation, Fremont, CA (US)

(72) Inventors: Andreas Fischer, Castro Valley, CA (US); Aaron Lynn Routzahn, Fremont, CA (US); Thorsten Bernd Lill, Kalaheo, HI (US); Seshasayee Varadarajan, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 384 days.

(21) Appl. No.: 17/905,104

(22) PCT Filed: Mar. 2, 2021

(86) PCT No.: PCT/US2021/020454
§ 371 (c)(1),
(2) Date: Aug. 26, 2022

(87) PCT Pub. No.: WO2021/178399
PCT Pub. Date: Sep. 10, 2021

(65) Prior Publication Data
US 2023/0093011 A1　　Mar. 23, 2023

Related U.S. Application Data

(60) Provisional application No. 62/986,485, filed on Mar. 6, 2020.

(51) Int. Cl.
H01L 21/311　　　(2006.01)
C23F 1/02　　　　(2006.01)
(Continued)

(52) U.S. Cl.
CPC .......... H01L 21/31116 (2013.01); C23F 1/02 (2013.01); H01J 37/32357 (2013.01);
(Continued)

(58) Field of Classification Search
None
See application file for complete search history.

(56) References Cited

U.S. PATENT DOCUMENTS

| | | | |
|---|---|---|---|
| 4,592,801 A | 6/1986 | Hara et al. | |
| 5,030,319 A | 7/1991 | Nishino et al. | |
| | (Continued) | | |

FOREIGN PATENT DOCUMENTS

| | | | |
|---|---|---|---|
| CN | 1550575 A | 12/2004 | |
| CN | 1552097 A | 12/2004 | |
| | (Continued) | | |

OTHER PUBLICATIONS

R. Leuschner and G. Pawlowski, "Photolithography", in Handbook of Semiconductor Technology, vol. 2, edited by K.A. Jackson and W. Schroter, Wiley-VCH, Weiheim, Chapter 4. (Year: 2000).*

(Continued)

*Primary Examiner* — Jiong-Ping Lu
(74) *Attorney, Agent, or Firm* — Weaver Austin Villeneuve & Sampson LLP

(57)　　　　　　ABSTRACT

Molybdenum is etched in a highly controllable manner by performing one or more etch cycles, where each cycle involves exposing the substrate having a molybdenum layer to an oxygen-containing reactant to form molybdenum oxide followed by treatment with boron trichloride to convert molybdenum oxide to a volatile molybdenum oxychloride with subsequent treatment of the substrate with a fluorine-containing reactant to remove boron oxide that has formed in a previous reaction, from the surface of the substrate. In some embodiments the method is performed in an absence (Continued)

of plasma and results in a substantially isotropic etching. The method can be used in a variety of applications in semiconductor processing, such as in wordline isolation in 3D NAND fabrication.

11 Claims, 7 Drawing Sheets

(51) Int. Cl.

| | | |
|---|---|---|
| *H01J 37/32* | (2006.01) | |
| *H01L 21/3213* | (2006.01) | |
| *H01L 21/67* | (2006.01) | |
| *H10B 69/00* | (2023.01) | |

(52) U.S. Cl.
CPC .. *H01J 37/32522* (2013.01); *H01L 21/32136* (2013.01); *H01L 21/32138* (2013.01); *H01L 21/67207* (2013.01); *H01J 2237/2001* (2013.01); *H01J 2237/332* (2013.01); *H01J 2237/334* (2013.01); *H01L 21/67167* (2013.01); *H10B 69/00* (2023.02)

(56) References Cited

U.S. PATENT DOCUMENTS

| | | | |
|---|---|---|---|
| 5,282,925 | A | 2/1994 | Jeng et al. |
| 5,411,631 | A | 5/1995 | Hori et al. |
| 5,766,971 | A | 6/1998 | Ahlgren et al. |
| 6,022,806 | A | 2/2000 | Sato et al. |
| 6,083,413 | A | 7/2000 | Sawin et al. |
| 6,177,353 | B1 | 1/2001 | Gutsche et al. |
| 6,482,745 | B1 | 11/2002 | Hwang |
| 7,115,522 | B2 | 10/2006 | Tomioka et al. |
| 7,196,955 | B2 | 3/2007 | Nickel |
| 7,416,989 | B1 | 8/2008 | Liu et al. |
| 7,795,148 | B2 | 9/2010 | Brown |
| 8,252,194 | B2 | 8/2012 | Kiehlbauch et al. |
| 8,617,411 | B2 | 12/2013 | Singh |
| 8,622,020 | B2 | 1/2014 | Thie et al. |
| 8,808,561 | B2 | 8/2014 | Kanarik |
| 8,883,028 | B2 | 11/2014 | Kanarik |
| 8,993,352 | B2 | 3/2015 | Nishimura et al. |
| 9,130,158 | B1 | 9/2015 | Shen et al. |
| 9,257,638 | B2 | 2/2016 | Tan et al. |
| 9,449,843 | B1 | 9/2016 | Korolik et al. |
| 9,520,821 | B1 | 12/2016 | Sheahan |
| 9,576,811 | B2 | 2/2017 | Kanarik et al. |
| 9,647,206 | B2 | 5/2017 | Hashimoto et al. |
| 9,768,033 | B2 | 9/2017 | Ranjan et al. |
| 9,805,941 | B2 | 10/2017 | Kanarik et al. |
| 9,806,252 | B2 | 10/2017 | Tan et al. |
| 9,837,312 | B1 | 12/2017 | Tan et al. |
| 9,870,899 | B2 | 1/2018 | Yang et al. |
| 9,972,504 | B2 | 5/2018 | Lai et al. |
| 9,991,128 | B2 | 6/2018 | Tan et al. |
| 9,997,371 | B1 | 6/2018 | Agarwal et al. |
| 10,096,487 | B2 | 10/2018 | Yang et al. |
| 10,374,144 | B2 | 8/2019 | Tan et al. |
| 10,566,212 | B2 | 2/2020 | Kanarik |
| 10,566,213 | B2 | 2/2020 | Kanarik et al. |
| 10,749,103 | B2 | 8/2020 | Tan et al. |
| 10,784,086 | B2 | 9/2020 | Yang et al. |
| 11,069,535 | B2 | 7/2021 | Lai et al. |
| 11,239,094 | B2 | 2/2022 | Kanarik |
| 11,450,513 | B2 | 9/2022 | Yang et al. |
| 11,721,558 | B2 | 8/2023 | Kanarik |
| 2001/0053585 | A1 | 12/2001 | Kikuchi et al. |
| 2002/0009883 | A1 | 1/2002 | Ogure et al. |
| 2002/0058409 | A1 | 5/2002 | Lin et al. |
| 2003/0003374 | A1 | 1/2003 | Buie et al. |
| 2003/0183952 | A1 | 10/2003 | Farrar |
| 2003/0232466 | A1 | 12/2003 | Zistl et al. |
| 2004/0004056 | A1 | 1/2004 | Sasaki et al. |

| | | | | |
|---|---|---|---|---|
| 2004/0137749 | A1 | 7/2004 | Ying et al. | |
| 2004/0209476 | A1 | 10/2004 | Ying et al. | |
| 2005/0006222 | A1 | 1/2005 | Ding et al. | |
| 2005/0098440 | A1 | 5/2005 | Kailasam et al. | |
| 2005/0167399 | A1 | 8/2005 | Ludviksson et al. | |
| 2005/0241933 | A1 | 11/2005 | Branton et al. | |
| 2006/0009040 | A1 | 1/2006 | Tomioka et al. | |
| 2006/0016781 | A1 | 1/2006 | Kuwabara et al. | |
| 2006/0169669 | A1 | 8/2006 | Zojaji et al. | |
| 2006/0194435 | A1 | 8/2006 | Nishimura et al. | |
| 2007/0049036 | A1 | 3/2007 | Huang | |
| 2007/0082508 | A1 | 4/2007 | Chiang et al. | |
| 2007/0202254 | A1 | 8/2007 | Ganguli et al. | |
| 2007/0238301 | A1 | 10/2007 | Cabral et al. | |
| 2007/0246442 | A1 | 10/2007 | America et al. | |
| 2009/0020884 | A1 | 1/2009 | Lee et al. | |
| 2009/0053426 | A1 | 2/2009 | Lu et al. | |
| 2009/0226611 | A1 | 9/2009 | Suzuki et al. | |
| 2009/0256220 | A1 | 10/2009 | Horng et al. | |
| 2010/0032760 | A1 | 2/2010 | Choi et al. | |
| 2011/0139748 | A1 | 6/2011 | Donnelly et al. | |
| 2011/0159690 | A1 | 6/2011 | Chandrashekar et al. | |
| 2011/0192820 | A1 | 8/2011 | Yeom et al. | |
| 2011/0212274 | A1 | 9/2011 | Selsley et al. | |
| 2011/0226734 | A1* | 9/2011 | Sumiya | H01L 21/67259 |
| | | | | 216/41 |
| 2012/0009785 | A1 | 1/2012 | Chandrashekar et al. | |
| 2012/0115329 | A1 | 5/2012 | Chandrashekar et al. | |
| 2012/0276657 | A1 | 11/2012 | Joubert et al. | |
| 2013/0023125 | A1 | 1/2013 | Singh | |
| 2013/0105303 | A1 | 5/2013 | Lubomirsky et al. | |
| 2013/0168354 | A1 | 7/2013 | Kanarik | |
| 2013/0330926 | A1 | 12/2013 | Chandrashekar et al. | |
| 2014/0170853 | A1 | 6/2014 | Shamma et al. | |
| 2015/0079798 | A1 | 3/2015 | Ling et al. | |
| 2015/0132961 | A1 | 5/2015 | Chang et al. | |
| 2015/0144154 | A1 | 5/2015 | Cho et al. | |
| 2015/0162168 | A1 | 6/2015 | Oehrlein et al. | |
| 2015/0162214 | A1 | 6/2015 | Thompson et al. | |
| 2015/0214474 | A1 | 7/2015 | Nishimura et al. | |
| 2015/0228495 | A1 | 8/2015 | Joubert et al. | |
| 2015/0235841 | A1 | 8/2015 | Zhu | |
| 2015/0243883 | A1 | 8/2015 | Swaminathan et al. | |
| 2015/0270140 | A1 | 9/2015 | Gupta et al. | |
| 2015/0345029 | A1 | 12/2015 | Wang et al. | |
| 2016/0013063 | A1 | 1/2016 | Ranjan et al. | |
| 2016/0020152 | A1 | 1/2016 | Posseme | |
| 2016/0064244 | A1 | 3/2016 | Agarwal et al. | |
| 2016/0203995 | A1 | 7/2016 | Kanarik et al. | |
| 2016/0308112 | A1 | 10/2016 | Tan et al. | |
| 2016/0314985 | A1 | 10/2016 | Yang et al. | |
| 2016/0358782 | A1 | 12/2016 | Yang et al. | |
| 2016/0379824 | A1 | 12/2016 | Wise et al. | |
| 2017/0040214 | A1 | 2/2017 | Lai et al. | |
| 2017/0053810 | A1 | 2/2017 | Yang et al. | |
| 2017/0069462 | A1 | 3/2017 | Kanarik et al. | |
| 2017/0084822 | A1 | 3/2017 | Kim et al. | |
| 2017/0117159 | A1 | 4/2017 | Kanarik et al. | |
| 2017/0170036 | A1 | 6/2017 | Fischer et al. | |
| 2017/0178920 | A1 | 6/2017 | Dole et al. | |
| 2017/0194204 | A1 | 7/2017 | Sowa | |
| 2017/0229311 | A1 | 8/2017 | Tan et al. | |
| 2017/0243755 | A1 | 8/2017 | Tapily | |
| 2018/0005850 | A1 | 1/2018 | Citla et al. | |
| 2018/0019387 | A1 | 1/2018 | Tan et al. | |
| 2018/0033635 | A1 | 2/2018 | Kanarik et al. | |
| 2018/0102236 | A1 | 4/2018 | Yang et al. | |
| 2018/0114700 | A1 | 4/2018 | Woo et al. | |
| 2018/0174860 | A1 | 6/2018 | Kanarik | |
| 2018/0182597 | A1 | 6/2018 | Blomberg et al. | |
| 2018/0223437 | A1* | 8/2018 | George | C23F 4/00 |
| 2018/0240682 | A1 | 8/2018 | Lai et al. | |
| 2018/0342403 | A1 | 11/2018 | Anthis et al. | |
| 2018/0350624 | A1 | 12/2018 | Kanarik et al. | |
| 2019/0044009 | A1 | 2/2019 | Yeom et al. | |
| 2019/0067014 | A1 | 2/2019 | Shrestha et al. | |
| 2019/0081088 | A1 | 3/2019 | Cho et al. | |
| 2019/0267249 | A1 | 8/2019 | Clark et al. | |
| 2019/0312194 | A1 | 10/2019 | Tan et al. | |

(56) References Cited

U.S. PATENT DOCUMENTS

| | | | |
|---|---|---|---|
| 2020/0027746 A1 | 1/2020 | Vervuurt et al. |
| 2020/0083167 A1 | 3/2020 | LaRoche et al. |
| 2020/0118835 A1 | 4/2020 | Kanarik |
| 2020/0286743 A1 | 9/2020 | Lai et al. |
| 2021/0005425 A1 | 1/2021 | Yang et al. |
| 2021/0305059 A1 | 9/2021 | Lai et al. |
| 2022/0093413 A1 | 3/2022 | Kanarik |
| 2022/0115244 A1 | 4/2022 | Lai et al. |
| 2022/0392747 A1 | 12/2022 | Yang et al. |
| 2023/0274939 A1 | 8/2023 | Lill et al. |

FOREIGN PATENT DOCUMENTS

| | | | |
|---|---|---|---|
| CN | 1568376 A | 1/2005 |
| CN | 101015047 A | 8/2007 |
| CN | 101351869 A | 1/2009 |
| CN | 101388359 A | 3/2009 |
| CN | 101631894 A | 1/2010 |
| CN | 103748658 A | 4/2014 |
| CN | 104272441 A | 1/2015 |
| CN | 104651893 A | 5/2015 |
| CN | 105308723 A | 2/2016 |
| CN | 105390437 A | 3/2016 |
| CN | 105789027 A | 7/2016 |
| CN | 106449360 A | 2/2017 |
| CN | 106469678 A | 3/2017 |
| EP | 0987745 A1 | 3/2000 |
| EP | 1469511 A2 | 10/2004 |
| JP | S6482550 A | 3/1989 |
| JP | H03263827 A | 11/1991 |
| JP | H06326060 A | 11/1994 |
| JP | H08306671 A | 11/1996 |
| JP | 2000063826 A | 2/2000 |
| JP | 2000150489 A | 5/2000 |
| JP | 2000323483 A | 11/2000 |
| JP | 2002510146 A | 4/2002 |
| JP | 2002537645 A | 11/2002 |
| JP | 2004349687 A | 12/2004 |
| JP | 2012529777 A | 11/2012 |
| JP | 2015002312 A | 1/2015 |
| JP | 2016028424 A | 2/2016 |
| JP | 2016208031 A | 12/2016 |
| KR | 20100056468 A | 5/2010 |
| KR | 20110098683 A | 9/2011 |
| KR | 20120005992 A | 1/2012 |
| KR | 20120024544 A | 3/2012 |
| KR | 20140035280 A | 3/2014 |
| KR | 20140051962 A | 5/2014 |
| KR | 20140087023 A | 7/2014 |
| KR | 20140109953 A | 9/2014 |
| KR | 20140116453 A | 10/2014 |
| KR | 20140133534 A | 11/2014 |
| KR | 20160124689 A | 10/2016 |
| KR | 20170017789 A | 2/2017 |
| KR | 20190028589 A | 3/2019 |
| KR | 20200010099 A | 1/2020 |
| KR | 20210125968 A | 10/2021 |
| TW | 200428532 A | 12/2004 |
| TW | 201140687 A | 11/2011 |
| TW | 201243941 A | 11/2012 |
| TW | 201643958 A | 12/2016 |
| TW | 201733128 A | 9/2017 |
| TW | 202141696 A | 11/2021 |
| WO | WO-9936956 A1 | 7/1999 |
| WO | WO-0049202 A2 | 8/2000 |
| WO | WO-02091461 A2 | 11/2002 |
| WO | WO-03031674 A1 | 4/2003 |
| WO | WO-2006004693 A2 | 1/2006 |
| WO | WO-2011081921 A2 | 7/2011 |
| WO | WO-2016100873 A1 | 6/2016 |
| WO | WO-2017099718 A1 | 6/2017 |
| WO | WO-2017205658 A1 | 11/2017 |
| WO | WO-2019118684 A1 | 6/2019 |
| WO | WO-2019190781 A1 | 10/2019 |
| WO | WO-2020014065 A1 | 1/2020 |

OTHER PUBLICATIONS

Boullart et al. (Mar. 29, 2013) "STT MRAM patterning challenges," Proc. SPIE , Advanced Etch Technology for Nanopatterning II, Proc. of SPIE 8685:86850F-1-86850F-9 [Retrieved on Jun. 2, 2015 from http://proceedings.spiedigitallibrary.org].

Cano, A.M. et al., "Thermal Atomic Layer Etching of $Al_2O_3$ Using Sequential HF and $BCl_3$ Exposures: Evidence for Combined Ligand-Exchange and Conversion Mechanisms", Chemistry of Materials, 2022, vol. 34, No. 14, pp. 6440-6449.

Carver, C.T. et al., "Atomic Layer Etching: An Industry Perspective," ECS Journal of Solid State Science and Technology, vol. 4, No. 6, Feb. 20, 2015, pp. N5005-N5009.

Chinese First Office Action dated Apr. 3, 2020 issued in CN 201710604639.4.

Chinese First Office Action dated Aug. 28, 2018 issued in CN 201610643282.6.

Chinese First Office Action dated Aug. 28, 2019 issued in Application No. CN 201710066218.0.

Chinese First Office Action dated Jan. 9, 2019 issued in Application No. CN 201610694927.9.

Chinese First Office Action dated Jun. 26, 2018 issued in Application No. CN 201610255293.7.

Chinese First Office Action dated Mar. 30, 2018 issued in CN 201610248296.8.

Chinese Fourth Office Action dated Sep. 8, 2020 issued in Application No. CN 201610694927.9.

Chinese Notification of Reexamination dated Jun. 15, 2020 issued in CN 201610643282.6.

Chinese Reexamination Decision dated Jan. 22, 2021 issued in CN 201610643282.6.

Chinese Reexamination Decision dated Mar. 2, 2021 issued in Application No. CN 201610694927.9.

Chinese Second Office Action dated Apr. 22, 2019 issued in CN CN 201610643282.6.

Chinese Second Office Action dated Dec. 27, 2018 issued in CN 201610248296.8.

Chinese Second Office Action dated Feb. 3, 2019 issued in Application No. CN 201610255293.7.

Chinese Second Office Action dated Jun. 17, 2019 issued in Application No. CN 201610694927.9.

Chinese Third Office Action dated Dec. 20, 2019 issued in Application No. CN 201610694927.9.

Chinese Third Office Action dated Sep. 27, 2019 issued in CN 201610643282.6.

CN Office Action dated Mar. 10, 2023, in Application No. CN201780086828.5 with English translation.

Ditizio, Robert and Werbaneth, Paul, Tegal Corporation and Zhu, Jian-Gang, Carnegie Mellon University (Jan. 2004) "Cell Shape and Patterning Considerations for Magnetic Random Access Memory (MRAM) Fabrication," Reprinted with permission from Semiconductor Manufacturing Magazine, 7 pp.

EP Search Report dated Nov. 22, 2021, in Application No. EP19778362.4.

Faraz, T. et al., "Atomic Layer Etching: What Can We Learn from Atomic Layer Deposition?," ECS Journal of Solid State Science and Technology, vol. 4, No. 6, pp. N5023-N5032.

International Preliminary Report on Patentability and written opinion dated Sep. 15, 2022, in PCT Application No. PCT/US2021/020454.

International Preliminary Report on Patentability dated Jul. 4, 2019 issued in Application No. PCT/US2017/066470.

International Preliminary Report on Patentability dated Mar. 16, 2023 in PCT Application No. PCT/US2021/046878.

International Preliminary Report on Patentability dated Oct. 15, 2020 issued in Application No. PCT/US2019/022520.

International Search Report and Written Opinion dated Jun. 21, 2021, in PCT Application No. PCT/US2021/020454.

International Search Report and Written Opinion dated Apr. 5, 2018 issued in Application No. PCT/US2017/066470.

International Search Report and Written Opinion dated Dec. 13, 2021, in PCT Application No. PCT/US2021/046878.

(56)                References Cited

OTHER PUBLICATIONS

International Search Report and Written Opinion dated Jan. 6, 2023 in PCT Application No. PCT/US2022/075996.
International Search Report and Written Opinion dated Jun. 28, 2019 issued in Application No. PCT/US2019/022520.
Japanese First Office Action dated Jun. 2, 2020 issued in Application No. JP 2016-082061.
Japanese Second Office Action dated Jan. 21, 2021 issued in Application No. JP 2016-082061.
Jiang et al. (1998) "Complexes Containing Unbridged Dative Metal-Metal Bonds and the Strong Acceptor Ru(CO)3(SiCl3)2 Moiety. Comments on the Transition Metal to Silicon Bond," Organometallics, 17(26):5810-5819.
Johnson, N.R. et al., "$WO_3$ and W Thermal Atomic Layer Etching Using "Conversion-Fluorination" and "Oxidation-Conversion-Fluorination" Mechanisms", ACS Applied Materials & Interfaces, 2017, vol. 9, pp. 34435-34447.
JP Office Action dated Jan. 5, 2022, in Application No. JP2019-533041 with English translation.
JP Office Action dated May 31, 2022, in Application No. JP20190533041 with English Translation.
Kanarik et al. (Aug. 2018) "Atomic Layer Etching: Rethinking the Art of Etch" The Journal of Physical Chemistry Letters, vol. 9, pp. 4814-4821. doi:10.1021/acs.jpclett.8b00997.
Kanarik et al. (Mar./Apr. 2015) "Overview of atomic layer etching in the semiconductor industry," J. Vac. Sci. Technol. A, 33(2):020802-1-020802-14.
Kanarik et al. (Nov. 2016) "Tech Brief: All About ALE" [webpage] pp. 1-3. URL:https://blog.lamresearch.com/tech-brief-all-about-ale/.
Kanarik, K.J. et al., "Predicting Synergy in Atomic Layer Etching," Journal of Vacuum Science & Technology A, Sep./Oct. 2017, vol. 35, No. 5, 05C302-1 through 05C302-7, 8 pages.
Korean First Office Action dated Nov. 29, 2020 issued in KR 10-2016-0099470.
Korean Second Office Action dated May 27, 2021 issued in KR 10-2016-0099470.
KR Office Action dated May 17, 2022, in Application No. KR10-2021-0133301 with English translation.
KR Office Action dated May 17, 2022, in Application No. KR10-2022-0022362 with English Translation.
KR Office Action dated Apr. 17, 2023, in Application No. KR10-2020-7031392 with English translation.
KR Office Action dated Aug. 25, 2022, in Application No. KR10-2019-7020687 with English translation.
KR Office Action dated Dec. 19, 2021, in Application No. KR1020210133301 with English translation.
KR Office Action dated Feb. 28, 2023, in Application No. KR10-2019-7020687 with English translation.
KR Office Action dated Jan. 27, 2023 in Application No. KR10-2022-0022362 with translation.
KR Office Action dated Jan. 27, 2023 in Application No. KR10-2022-0176130 with translation.
KR Office Action dated Mar. 3, 2023, in Application No. KR10-2019-7021389 with English translation.
KR Office Action dated May 31, 2022, in Application No. KR10-2021-0133296 with English translation.
KR Office Action dated Oct. 31, 2021, in Application No. KR1020210133296 with English translation.
KR Office Action dated Sep. 13, 2022, in Application No. KR10-2019-7021389 With English Translation.
KR Office Action dated Sep. 19, 2022, in Application No. KR10-2021-0133301 with English translation.
Lee et al. (2015) "Atomic Layer Etching of Al2O3 Using Sequential, Self-Limiting Thermal Reactions with Sn(acac)2 and Hydrogen Fluoride," ACSNANO,9(2):2061-2070.
Min, K.S. et al., "Atomic layer etching of $Al_2O_3$ using $BCl_3$/Ar for the interface passivation layer of III-V MOS devices", Microelectronic Engineering, Apr. 9, 2013, vol. 110, pp. 457-460.

PCT International Search Report and Written Opinion dated Feb. 25, 2016 issued in PCT/US2015/066789.
Pomeroy, R.K. and Wijesekera, K.S. (1980) "Preparation and derivatives of cis-M(CO)4(SiCl3)2 (M=Fe, Ru, Os)," Inorg. Chem., 19(12):3729-3735.
Safranek, Berkenkotter, and Stephens, (1990) "Electroless Cobalt and Cobalt Alloys," Electroless Plating, William Andrew Publishing, Chapter 18, Section 1:pp. 463-480 and Section 2:pp. 481-509.
Schmitt et al. (2006) "Synthesis and Properties of Single-Crystal FeSi Nanowires," Nano Lett., 6(8):1617-1621.
Schmitt et al. (Feb. 1, 2008) "Chemical Synthesis and Magnetotransport of Magnetic Semiconducting Fe1-xCoxSi Alloy Nanowires," Nano Lett., 8(3):810-815.
Singapore Notice of Eligibility for Grant and Supplementary Examination Report SG application No. 10201606891S dated Jan. 9, 2020.
Singapore Search Report and Written Opinion dated Jul. 9, 2018 issued in Application No. SG 10201603092R.
Singapore Search Report and Written Opinion dated Jun. 28, 2018 issued in SG 10201603090V.
Taiwanese First Office Action dated Jul. 23, 2020 issued in Application No. TW 106103603.
Taiwanese First Office Action dated Jun. 17, 2021 issued in Application No. TW 106144335.
Taiwanese First Office Action dated Mar. 17, 2020 issued in TW 105124539.
Taiwanese Notice of Allowance dated Dec. 27, 2019 issued in Application No. TW 105112529.
Taiwanese Second Office Action dated Feb. 25, 2021 issued in TW 105124539.
TW Office Action dated Jan. 6, 2023, in Application No. TW110125242 with English translation.
TW Office Action dated Jan. 14, 2022, in Application No. TW106144335 with English translation.
TW Office Action dated Dec. 2, 2022 in Application No. TW111100554 with English translation.
TW Office Action dated Dec. 26, 2022 in Application No. TW105124539 with English translation.
TW Office Action dated Mar. 7, 2023 in Application No. TW111100554 with English translation.
US Final Office Action dated Feb. 7, 2017 issued in U.S. Appl. No. 14/830,683.
US Final Office Action dated Jan. 3, 2020 issued in U.S. Appl. No. 15/954,509.
US Final Office Action dated Jul. 9, 2021 issued in U.S. Appl. No. 16/717,385.
US Final Office Action dated Mar. 30, 2017 issued in U.S. Appl. No. 14/749,285.
US Final Office Action dated Mar. 5, 2020 issued in U.S. Appl. No. 15/824,987.
US Final Office Action dated Sep. 16, 2019 issued in U.S. Appl. No. 15/841,205.
US Final Office Action dated Sep. 23, 2016 issued in U.S. Appl. No. 14/749,285.
U.S. Non-Final Office Action dated Jun. 23, 2023, in U.S. Appl. No. 17/304,174.
U.S. Notice of Allowance dated Apr. 3, 2023 in U.S. Appl. No. 17/457,909.
U.S. Notice of Allowance dated Apr. 10, 2023 in U.S. Appl. No. 17/457,909.
US Notice of Allowance dated Apr. 25, 2018 issued in U.S. Appl. No. 15/421,189.
US Notice of Allowance dated Dec. 2, 2019 issued in U.S. Appl. No. 15/841,205.
US Notice of Allowance dated Dec. 2, 2019 issued in U.S. Appl. No. 16/049,320.
U.S. Notice of Allowance dated Dec. 22, 2022 in U.S. Appl. No. 17/457,909.
US Notice of Allowance dated Jan. 11, 2018 issued in U.S. Appl. No. 14/830,683.
US Notice of Allowance dated Jun. 30, 2017 issued in U.S. Appl. No. 14/749,291.

(56) References Cited

OTHER PUBLICATIONS

US Notice of Allowance dated Mar. 19, 2021 issued in U.S. Appl. No. 15/929,854.
US Notice of Allowance dated Mar. 22, 2019 issued in U.S. Appl. No. 15/719,497.
US Notice of Allowance dated May 10, 2018 issued in U.S. Appl. No. 15/239,138.
US Notice of Allowance dated May 11, 2020 issued in U.S. Appl. No. 15/824,987.
U.S. Notice of Allowance dated May 17, 2022 in U.S. Appl. No. 16/976,737.
US Notice of Allowance dated Sep. 22, 2021 issued in U.S. Appl. No. 16/717,385.
US Notice of Allowance dated Sep. 28, 2017 issued in U.S. Appl. No. 15/286,421.
US Notice of Allowance dated Sep. 29, 2017 issued in U.S. Appl. No. 14/749,285.
US Notice of Allowance [Supplemental] dated Oct. 26, 2017 issued in U.S. Appl. No. 15/286,421.
US Office Action dated Apr. 10, 2019 issued in U.S. Appl. No. 15/841,205.
US Office Action dated Aug. 11, 2017 issued in U.S. Appl. No. 14/749,285.
US Office Action dated Aug. 25, 2017 issued in U.S. Appl. No. 15/239,138.
US Office Action dated Dec. 10, 2020 issued in U.S. Appl. No. 15/929,854.
US Office Action dated Dec. 14, 2018 issued in U.S. Appl. No. 15/719,497.
US Office Action dated Feb. 17, 2017 issued in U.S. Appl. No. 14/749,285.
US Office Action dated Feb. 26, 2021 issued in U.S. Appl. No. 16/717,385.
US Office Action dated Jul. 1, 2016 issued in U.S. Appl. No. 14/830,683.
US Office Action dated Jul. 25, 2017 issued in U.S. Appl. No. 14/830,683.
US Office Action dated Mar. 24, 2017 issued in U.S. Appl. No. 15/286,421.
US Office Action dated May 1, 2019 issued in U.S. Appl. No. 15/954,509.
US Office Action dated May 5, 2016 issued in U.S. Appl. No. 14/749,285.
US Office Action dated Nov. 28, 2016 issued in U.S. Appl. No. 14/749,291.
US Office Action dated Nov. 29, 2017 issued in U.S. Appl. No. 15/421,189.
US Office Action dated Nov. 5, 2021 issued in U.S. Appl. No. 16/976,737.
US Office Action dated Sep. 19, 2019 issued in U.S. Appl. No. 15/824,987.
US Office Action dated Sep. 6, 2019 issued in U.S. Appl. No. 16/049,320.
U.S. Appl. No. 18/002,788, inventors Thorsten Bernd Lill et al., filed on Dec. 21, 2022.
U.S. Restriction requirement dated Jun. 15, 2023 in U.S. Appl. No. 17/645,719.
U.S. Restriction requirement dated Mar. 17, 2023 in U.S. Appl. No. 17/304,174.
Wolf S., et al., "Silicon Processing for the VLSI Era," Process Technology, 1986, vol. 1, 16 pages.
Zywotko, D.R. et al., "Thermal Atomic Layer Etching of ZnO by a "Conversion-Etch" Mechanism Using Sequential Exposures of Hydrogen Fluoride and Trimethylaluminum", Chemistry of Materials, 2017, vol. 29, pp. 1183-1191.
CN Office Action dated May 18, 2024 in CN Application No. 201980024060.8 with English translation.
CN Office Action dated May 24, 2024 in CN Application No. 202110431456.3, with English Translation.

CN Office Action dated Oct. 31, 2023 in CN Application No. CN201780086828.5 with English translation.
International Preliminary Report on Patentability and Written Opinion dated Mar. 21, 2024 in PCT Application No. PCT/US2022/075996.
JP Office Action dated Nov. 19, 2024 in JP Application No. 2022-552301, with English Translation.
KR Notice of Allowances dated Sep. 5, 2024 in KR Application No. 10-2023-7034721 with English Translation.
KR Office Action dated Apr. 30, 2024 in KR Application No. 10-2017-0014362 with English translation.
KR Office Action dated Aug. 29, 2023, in Application No. KR10-2022-0022362 with English Translation.
KR Office Action dated Dec. 6, 2023, in application No. 10-2023-7034721, with English Translation.
KR Office Action dated Jan. 28, 2024 in KR Application No. 10-2022-0022362 with English Translation.
KR Office Action dated Jul. 16, 2023, in application No. KR 10-2016-0104869 with English translation.
KR Office Action dated Jul. 20, 2024 in KR Application No. 10-2024-0056777, with English Translation.
KR Office Action dated Jul. 21, 2024 in KR Application No. 10-2024-0056792 with English translation.
Parkhomenko R., et al., "Deposition of Pure Gold Thin Films from Organometallic Precursors", Journal of Crystal Growth, 2014, vol. 414, pp. 143-150.
TW Office Action dated Jun. 7, 2023 in Application No. TW110125242 with English Translation.
TW Office Action dated Jun. 20, 2024 in TW Application No. 110107682 with English translation.
TW Office Action dated Jun. 28, 2023 in Application No. TW111100554 with English translation.
U.S. Advisory Action dated Dec. 15, 2023 in U.S. Appl. No. 17/304,174.
U.S. Advisory Action dated Jun. 25, 2024 in U.S. Appl. No. 17/645,719.
U.S. Final Office Action dated Apr. 16, 2024 in U.S. Appl. No. 17/645,719.
U.S. Final Office Action dated May 14, 2024 in U.S. Appl. No. 17/304,174.
U.S. Final office Action dated Oct. 6, 2023 in U.S. Appl. No. 17/304,174.
U.S. Non-Final Office Action dated Jan. 31, 2024 in U.S. Appl. No. 17/304,174.
U.S. Non-Final Office Action dated Jul. 25, 2024 in U.S. Appl. No. 17/645,719.
U.S. Non-Final Office Action dated Oct. 4, 2023, in U.S. Appl. No. 17/645,719.
U.S. Notice of Allowance dated Jun. 28, 2021 in U.S. Appl. No. 15/929,854.
U.S. Notice of Allowance dated May 19, 2021 in U.S. Appl. No. 15/929,854.
U.S. Restriction Requirement dated Apr. 21, 2016 in U.S. Appl. No. 14/830,683.
U.S. Restriction Requirement dated Feb. 6, 2019 in U.S. Appl. No. 15/954,509.
Wu, F., et al., "Patterning of Cu Films by a Two-Step Plasma Etching Process at Low Temperature," Journal of The Electrochemical Society, 2010, vol. 157 (4), pp. H474-H478.
CN Office Action dated Dec. 26, 2024 in CN Application No. 201980024060.8, with English Translation.
CN Office Action dated Jan. 14, 2025 in CN Application No. 202110431456.3, with English Translation.
JP Decision to Grant and Search Report dated Mar. 18, 2025 in JP Application No. 2023-513308, with English translation.
KR Notice of Allowance dated Feb. 21, 2025 in KR Application No. 10-2017-0014362, with English Translation.
KR Office Action dated Apr. 18, 2025 in KR Application No. 10-2022-7034737, with English Translation.
KR Office Action dated Apr. 25, 2025 in KR Application No. 10-2024-0056777, with English Translation.
KR Office Action dated Apr. 28, 2025 in KR Application No. 10-2024-0056792, with English Translation.

(56)            References Cited

OTHER PUBLICATIONS

KR Office Action dated May 14, 2025 in KR Application No. 10-2024-7006335 with English Translation.
U.S. Final Office Action dated Nov. 27, 2024 in U.S. Appl. No. 17/645,719.
U.S. Non-Final Office Action dated Apr. 10, 2025 in U.S. Appl. No. 17/821,107.
US Non-Final Office Action dated May 2, 2025 in U.S. Appl. No. 18/002,788.
U.S. Restriction Requirement dated Feb. 6, 2025 in U.S. Appl. No. 18/002,788.
CN Office Action dated Jun. 6, 2025 in CN Application No. 201980024060.8, with English Translation.
TW Office Action and Search Report dated Aug. 19, 2025 in TW Application No. 114106245, with English Translation.
KR Office Action dated Oct. 22, 2025 in KR Application No. 10-2022-7045273, with English Translation.
U.S. Final Office Action dated Dec. 3, 2025 in U.S. Appl. No. 17/821,107.
U.S. Final Office Action dated Oct. 28, 2025 in U.S. Appl. No. 18/002,788.

* cited by examiner

Provide a substrate having a recessed feature and a molybdenum layer exposed on the sidewalls of the recessed feature, where the molybdenum layer electrically connects conductive layers in a 3D NAND structure    201

Controllably etch a desired amount of molybdenum from the sidewalls using provided methods    203

Achieve node separation in the 3D NAND structure    205

| 305 | | | | | 305 | |
| 307 | | | | | 307 | |
| 309 | 305 | 303 | 305 | 309 | |
| 307 | | —311 | | 307 | |
| 309 | 305 | | 305 | 309 | |
| 307 | | | | | 307 | |
| 301 | | | | | | |

| 307 | | | | | 307 | |
| 309 | 305 | 303 | 305 | 309 | |
| 307 | | | | | 307 | |
| 309 | 305 | | 305 | 309 | |
| 307 | | | | | 307 | |
| 301 | | | | | | |

ATOMIC LAYER ETCHING OF MOLYBDENUM

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

FIELD OF THE INVENTION

This invention pertains to methods and apparatuses for semiconductor device manufacturing. Specifically, embodiments of this invention pertain to methods and apparatuses for controlled etching of molybdenum in semiconductor processing.

BACKGROUND

In semiconductor device fabrication, deposition and etching techniques are used for forming patterns of materials, such as for forming metal lines embedded in dielectric layers. Deposition techniques include atomic layer deposition (ALD), chemical vapor deposition (CVD), and physical vapor deposition (PVD). Etching techniques include wet etching methods and dry etching methods, such as reactive ion etching (RIE).

Etching methods may be isotropic and anisotropic. Isotropic etching is characterized by etching in multiple directions on the substrate (both vertical and horizontal), where the etch rates in different directions are substantially the same. Isotropic etching is needed, for example, for horizontal etching. Anisotropic etching is characterized by etching predominantly in one direction, such as in a vertical direction, and is often used for forming recessed features (e.g., vias) on a substrate. Anisotropic etching is also known as "directional etching".

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Methods and apparatuses for controllable etching of molybdenum are provided. The methods, in some embodiments, allow for controlled removal of only a few atomic layers of molybdenum (e.g. about 10 Å) per etch cycle. By repeating the etch cycle multiple times, removal of larger amounts of molybdenum (e.g. 2-2000 nm) with atomic level precision is achieved. Provided methods can be used for isotropic etching of molybdenum, including, but not limited to etching of molybdenum in 3D NAND node separation. Provided methods can also be used for directional etching, if process conditions (such as plasma conditions) are adjusted to favor directional etching.

In one aspect, a method of etching a molybdenum layer on a semiconductor substrate is provided. The method includes: (a) exposing the semiconductor substrate to an oxygen-containing reactant to oxidize at least a portion of the molybdenum layer to molybdenum oxide; (b) after the molybdenum oxide has formed, exposing the semiconductor substrate to boron trichloride to convert the molybdenum oxide to a volatile molybdenum oxychloride while forming boron oxide on the semiconductor substrate; and (c) exposing the semiconductor substrate to a fluorine-containing reactant to remove the boron oxide from the semiconductor substrate. These steps (a)-(c) constitute one etch cycle, and can be repeated as many times as necessary to etch a desired amount of molybdenum. For example, between about 2-50-etch cycles can be performed. In some implementations one etch cycle that includes steps (a)-(c) and a single etch cycle controllably removes between about 8-15 Å of molybdenum layer. In some embodiments, these steps are performed in an absence of plasma. In some embodiments the etching of molybdenum layer is isotropic. These steps (a)-(c) can be performed in one process chamber, which is, in some embodiments, purged after each step of the etch cycle.

In some implementations the oxygen-containing reactant is $O_2$, $O_3$ or their mixture, where the oxygen-containing reactant (e.g., $O_2$) is optionally activated in a plasma. For example oxygen radicals formed using a remote plasma source or oxygen ions from an in situ (direct) oxygen plasma can be used. In some embodiments, the fluorine-containing reactant that is used to remove boron oxide, is HF.

The etch cycle in some implementations is performed at a temperature of between about 100-400° C., e.g., between about 150-250° C.

In one application, the provided method is used to etch the molybdenum layer from sidewalls of a recessed feature on the semiconductor substrate. For example the molybdenum layer can be etched (preferably isotropically) during word-line isolation in fabrication of a 3D NAND structure.

In another aspect, an apparatus for processing a substrate is provided, where the apparatus includes a controller having program instructions configured to effect any of the methods described herein. In one embodiment the apparatus includes a process chamber, configured for housing the substrate, wherein the process chamber includes a substrate holder configured to hold a substrate, an inlet configured to introduce one or more reactants to the process chamber, and a controller having program instructions configured to effect etching of a molybdenum layer on the semiconductor substrate by causing: (i) an exposure of the substrate having the molybdenum layer to an oxygen-containing reactant to oxidize at least a portion of the molybdenum layer to molybdenum oxide; (ii) an exposure of the substrate to boron trichloride to convert the molybdenum oxide to a volatile molybdenum oxychloride while forming boron oxide on the semiconductor substrate; and (iii) an exposure of the substrate to a fluorine-containing reactant to remove the boron oxide from the substrate. The controller can also include instructions configured for repeating steps (i)-(iii), with optional purging after each step.

In some embodiments the apparatus further includes a heater and the program instructions include program instructions configured to maintain a temperature of between about 100-400° C. during etching of the molybdenum layer.

In some implementations the apparatus is further configured for deposition of materials on the semiconductor substrate (e.g., for deposition of molybdenum prior to molybdenum etching).

In some embodiments the apparatus is configured for activating the oxygen-containing reactant in a plasma.

In another aspect, non-transitory computer-readable medium is provided, which includes program instructions for control of an apparatus configured for semiconductor substrate processing, wherein the program instructions comprise code configured to effect etching of a molybdenum layer by causing: (i) an exposure of the substrate having the molybdenum layer to an oxygen-containing reactant to oxidize at least a portion of the molybdenum layer to molybdenum oxide; (ii) an exposure of the substrate to boron trichloride to convert the molybdenum oxide to a volatile molybdenum oxychloride while forming boron oxide on the semiconductor substrate; and (iii) an exposure of the substrate to a fluorine-containing reactant to remove the boron oxide from the semiconductor substrate.

Provided methods and apparatus can be used in conjunction with methods and systems used for photolithographic patterning. In one aspect, a system is provided, which includes the apparatus described herein and a stepper. In some embodiments, provided methods further involve: applying photoresist to the semiconductor substrate: exposing the photoresist to light; patterning the photoresist and transferring the pattern to the semiconductor substrate; and selectively removing the photoresist from the semiconductor substrate.

These and other aspects of implementations of the subject matter described in this specification are set forth in the accompanying drawings and the description below.

DETAILED DESCRIPTION OF THE PREFERRED EMBODIMENTS

Methods and apparatuses for molybdenum etching are provided. Provided methods can be used in a variety of applications but are particularly useful for isotropic or weakly directional etching of molybdenum in semiconductor device fabrication. In some embodiments provided methods are used in substantially isotropic etching of molybdenum from the sidewalls of a recessed feature on a semiconductor substrate. For example, provided methods can be used during node separation (wordline separation) in 3D NAND device fabrication. The described methods can provide atomic level control over the amount of etched material, as each etch cycle can be used to controllably remove as little as 1-3 atomic layers of molybdenum. Such controlled etching is referred to as atomic layer etching (ALE) and is suitable for etching of molybdenum layers of a variety of thicknesses.

The term "molybdenum" as used herein refers to metallic molybdenum (molybdenum in zero oxidation state). In some embodiments, molybdenum has at least about 90% purity (molybdenum content), such as at least about 95% purity by weight. Provided methods can be used, for example, for etching CVD-deposited molybdenum, ALD-deposited molybdenum, and PVD-deposited molybdenum.

The term "semiconductor substrate" as used herein refers to a substrate at any stage of semiconductor device fabrication containing a semiconductor material anywhere within its structure. It is understood that the semiconductor material in the semiconductor substrate does not need to be exposed. Semiconductor wafers having a plurality of layers of other materials (e.g., dielectrics) covering the semiconductor material, are examples of semiconductor substrates. The following detailed description assumes the disclosed implementations are implemented on a semiconductor wafer, such as on a 200 mm, 300 mm, or 450 mm semiconductor wafer. However, the disclosed implementations are not so limited. The semiconductor wafer may be of various shapes, sizes, and materials. In addition to semiconductor wafers, other types of work pieces may take advantage of the disclosed implementations including various articles such as printed circuit boards and the like.

The term "about" when used in reference to numerical values includes a range of ±10% of the recited numerical value, unless otherwise specified.

Figure 1:
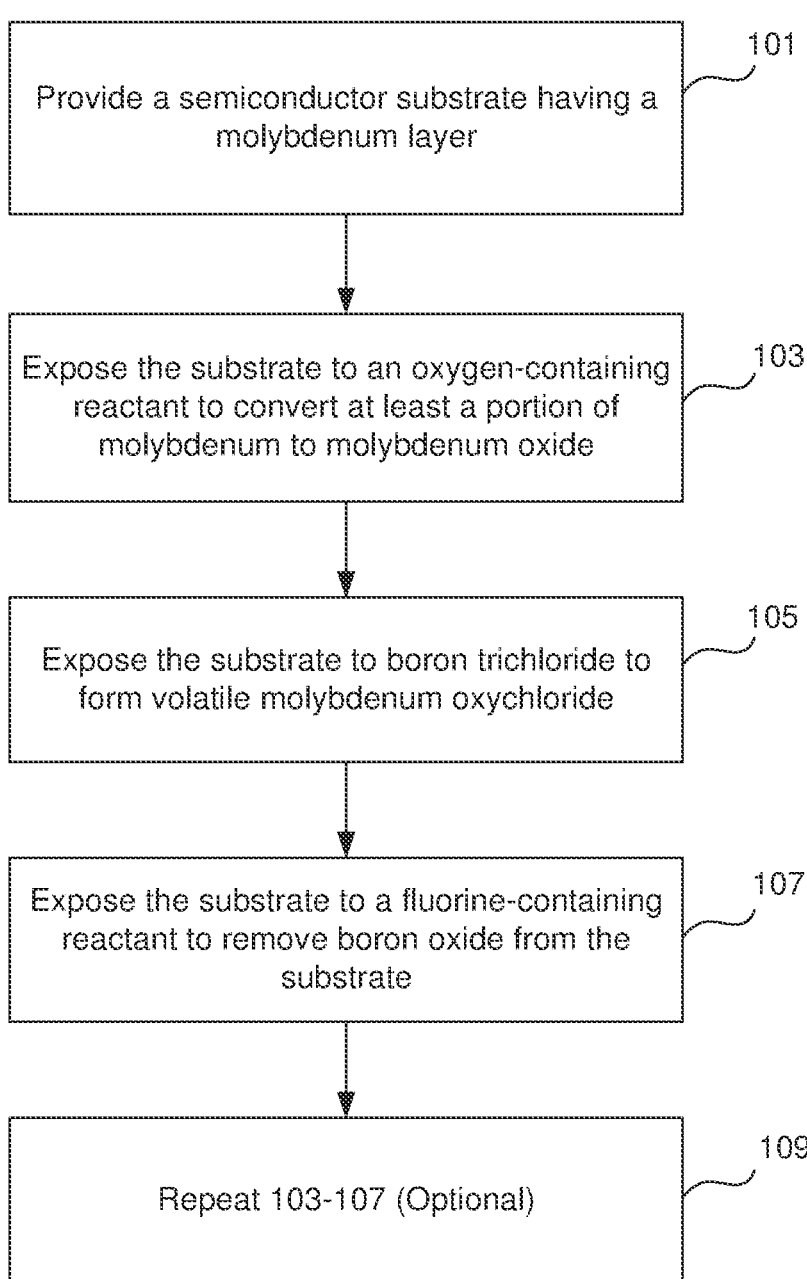
FIG. 1 is a process flow diagram for a molybdenum etching method according to an embodiment provided herein.

FIG. 1 shows a process flow diagram for a molybdenum etching method, in accordance with one embodiment provided herein. The process starts in step 101, by providing a semiconductor substrate having a molybdenum layer. Generally, the methods can be used for etching one or more molybdenum layers on a wide variety of substrates. For example, the molybdenum layer may reside on a sidewall of a recessed feature on a substrate. In another example, the molybdenum layer may be a horizontal molybdenum overburden residing over a dielectric layer. In yet another example, the molybdenum layer may be filling at least a part of a recessed feature on a substrate. The molybdenum layer on the provided substrate is exposed such that it is accessible to gaseous reactants. The substrate may be processed in any suitable apparatus having a process chamber equipped with a substrate holder (e.g., a pedestal) and an inlet for introduction of reactants, where the apparatus may be optionally configured for generating a plasma directly in the process chamber or remotely.

In step 103, the substrate is exposed to an oxygen-containing reactant to undergo molybdenum oxidation (i.e., converting at least a portion of the molybdenum layer to molybdenum oxide). "Molybdenum oxide" as used herein refers to a $Mo_xO_y$ compound that contains molybdenum and oxygen, where x and y indicate that the stoichiometry may vary. Examples of suitable oxygen-containing reactants for molybdenum oxidation include ozone ($O_3$) and oxygen ($O_2$). The oxidation reaction in some embodiments is carried out in an absence of plasma (thermally). In one implementation, molybdenum is converted to molybdenum oxide by treating the substrate with ozone in an absence of plasma. In another implementation, molybdenum oxide is formed by treating the substrate with plasma-activated $O_2$. In some embodiments, plasma is generated directly in the process chamber housing the substrate. In other embodiments, plasma is generated remotely, away from the substrate (e.g., outside the process chamber housing the substrate), and is fed to the process chamber that houses the substrate. Thermal oxidation with $O_2$ is also possible at higher temperatures.

Thermal (plasma-free) oxidation is preferred for applications where isotropic etching is desired. Plasma-assisted oxidation can also be used to achieve isotropic or weakly anisotropic etching, if remote plasma and/or low or no bias at the substrate pedestal is used during oxidation. For example, remote plasma (e.g., oxygen radicals formed away from the substrate) or thermal oxidation, in some embodiments, is used to achieve isotropic etching of molybdenum.

The molybdenum oxide formation step 103 is used to control the amount of molybdenum that will be etched in one etch cycle. The time of the substrate's exposure to the oxygen-containing reactant can be used as the controlling factor for the amount of molybdenum that is to be converted to molybdenum oxide. In some embodiments, the time of exposure is controlled such as to convert about 1-5, such as about 3 atomic layers of molybdenum to molybdenum oxide. It is noted that subsequent reactions in one etch cycle will be limited by the amount of formed molybdenum oxide in the first reaction. In some implementations, the exposure time to the oxygen-containing reactant is selected to be between about 10 seconds and 3 minutes.

After formation of molybdenum oxide is completed, the oxygen-containing reactant may be optionally removed from the process chamber by purging and/or evacuation. In some embodiments, the process chamber is purged with an inert gas such as helium, argon or $N_2$.

Next, in step 105, the substrate is exposed to boron trichloride ($BCl_3$) to convert molybdenum oxide to a volatile molybdenum oxychloride. Molybdenum oxychloride refers to $MoO_xCl_y$ compound, where x and y indicate that the stoichiometry may vary. Molybdenum oxychloride is typically removed from the surface of the substrate as it is formed, leaving behind a layer of non-volatile boron oxide on the surface of the substrate. The reaction between boron trichloride and molybdenum oxide is conducted such that all of the molybdenum oxide that has formed in a previous reaction is converted to molybdenum oxychloride. Next, molybdenum oxychloride is optionally removed from the process chamber by purging and/or evacuation, and the next step of the etch cycle follows.

In the next step, 107, the substrate is exposed to a fluorine-containing reactant to remove boron oxide that has been previously left behind on the surface of the substrate. The fluorine-containing reactant reacts with boron oxide and converts it to a volatile boron trifluoride which is removed from the surface of the substrate (e.g., during the course of the reaction). In some embodiments, the fluorine-containing reactant is gaseous hydrogen fluoride (HF). After the reaction, the process chamber may be optionally purged and/or evacuated to remove hydrogen fluoride and boron trifluoride.

Next, in step 109, the etch cycle that includes steps 103-107 is optionally repeated to etch more molybdenum if desired. While in some embodiments only one cycle (steps 103-107) is performed, in many other embodiments, between about 2-100 etch cycles, such as between about 5-50 etch cycles are performed, where each cycle includes molybdenum oxidation 103, molybdenum oxychloride formation 105, and boron oxide removal 107. In one embodiment, each etch cycle removes between about 5-15 Å, such as about 1 nm of molybdenum. The described methods can be used for removal of various amounts of molybdenum with high precision. For example, between about 1-2,000 nm of molybdenum, such as between about 1-20 nm of molybdenum can be etched with atomic level precision, and, if desired, isotropically.

All steps of the etch cycle are preferably performed in one process chamber and at a single temperature, although it is possible to vary the temperature between the steps if desired. The temperatures and pressures are selected such as to ensure that the reactants and volatile products (e.g., molybdenum oxychloride) remain in a gaseous form, and to achieve high rates of reactions. For example, temperatures of between about 100-400° C. can be used. When oxygen plasma is used during the oxidation step, the etch cycle can be performed, for example, at a temperature of between about 150-250° C. When oxygen is used in an absence of plasma, higher temperatures, such as temperatures of between about 400-600° C. (e.g., about 400° C.), are preferred in some embodiments. The pressure, in some implementations, is in the range of between about mTorr and 5 Torr, e.g., between about 20-500 mTorr. The reactants are introduced into the process chamber in gaseous form. In some embodiments, the reactants can be introduced with a carrier gas, such as helium or argon. However, it is preferred in some embodiments to introduce the reactants without adding the carrier gas to maximize the reaction rates. Thus, in some embodiments, the process gas introduced into the process chamber during each step of the etch cycle consists essentially of the reactant (e.g., $O_2$ and/or $O_3$ for the first step, $BCl_3$ for the second step and HF for the third step). In some implementations, the process chamber is pre-coated with silicon tetrachloride ($SiCl_4$) prior to the etch cycles in order to prevent corrosion of chamber walls by $BCl_3$ and HF.

The described etching methods can be used in a variety of applications in semiconductor processing but are particularly useful for applications where substantially isotropic removal of molybdenum with high level of control over removed layer thickness is desired. Provided methods are particularly useful for etching a desired amount of molybdenum on a substrate without fully removing an entire exposed molybdenum layer. One example of such applications is node separation in fabrication of 3D NAND structures.

Figure 2:
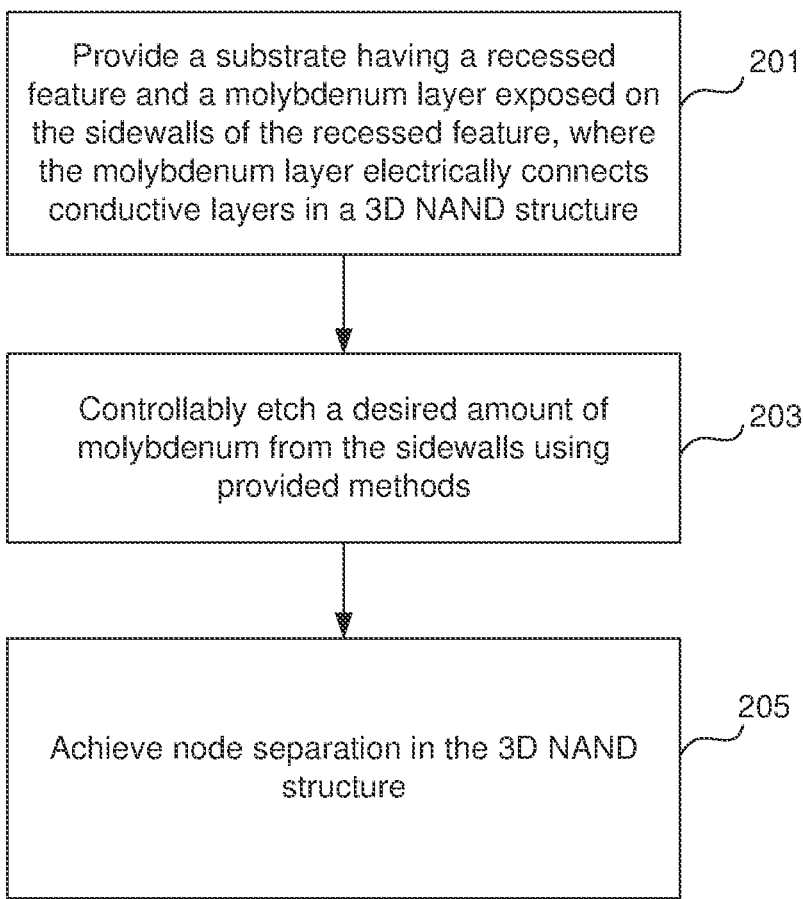
FIG. 2 is a process flow diagram for using a molybdenum etch method in 3D NAND structure fabrication according to an embodiment provided herein.
Figures 3A, 3B:
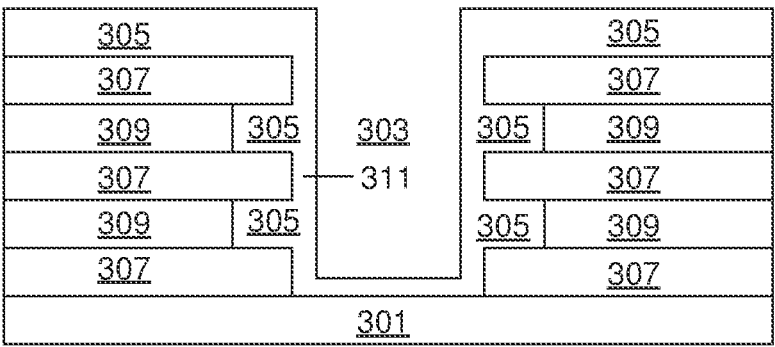
FIGS. 3A and 3B provide schematic cross-sectional views of semiconductor devices before and after molybdenum etching in 3D NAND structure fabrication, according to an embodiment provided herein.

FIG. 2 is a process flow diagram illustrating the use of a provided molybdenum etching method in 3D NAND fabrication. The process starts in step 201 by providing a substrate having a recessed feature and a molybdenum layer exposed on the sidewalls of a recessed feature, where the molybdenum layer electrically connects conductive layers in a 3D NAND structure. An example of such partially fabricated 3D NAND structure is shown in FIG. 3A, which illustrates a schematic cross-sectional view of the structure. The substrate includes a bottom layer 301, which may be silicon, a stack of layers formed over the bottom layer 301, and a recessed feature 303 formed in the stack of layers. It is understood that typically 3D NAND structures have significantly more layers in the stack than is shown in the simplified FIG. 3A. For example, a typical 3D NAND structure has between about 5-100 conductive and dielectric layers (combined) in the stack. A molybdenum layer 305 covers the sidewalls and the bottom portion of the recessed feature 303, as well as the top of the stack (field region). The stack of layers is formed from alternating layers of dielectric material 307 (e.g., silicon oxide), and conductive material 309 (e.g., tungsten), where the layers of conductive material 309 are the wordlines of the 3D NAND structure. It can be seen that the molybdenum layer 305 in the structure shown in FIG. 3A electrically connects the conductive layers 309 via the portion 311 on the sidewalls of the recessed feature 303. In order to electrically isolate the conductive layers 309 from each other, molybdenum layer 305 needs to be removed from the sidewalls of the recessed feature 303, but in a controlled manner, without forming large recesses in molybdenum portions 305 of the wordlines. This step is known as 3D NAND node separation.

Figure 3C:
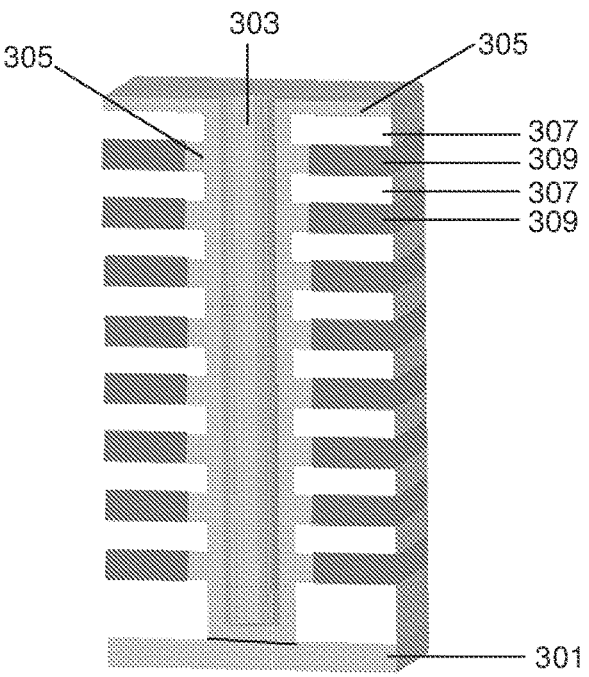
FIGS. 3C and 3D provide different views of semiconductor devices before and after molybdenum etching in 3D NAND structure fabrication according to an embodiment provided herein.
Figure 3D:
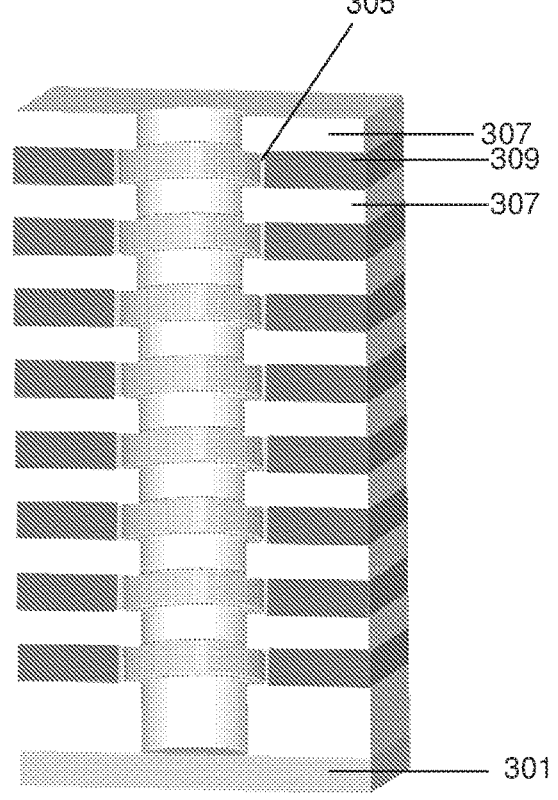

Referring to the process diagram of FIG. 2, the process follows in step 203 by controllably etching the desired amount of molybdenum from the sidewalls using provided methods. The etching is continued until, as shown in step 205, node separation is achieved, and the conductive layers 309 in the 3D NAND structure are isolated. The resulting structure is shown in FIG. 3B. The molybdenum etching in this case removed a sufficient amount of molybdenum from the sidewalls to isolate the conductive layers 309 without fully removing molybdenum 305 at the terminal parts of the conductive layers 309. Typically, in this application, provided etching methods can be used to remove between about 1-20 nm of molybdenum. The etch in this case also removed molybdenum from the field region on the top of the stack, as well as molybdenum at the bottom of the recessed feature 303. Schematic views of another partially fabricated 3D NAND structure before and after the etch are shown in FIGS. 3C and 3D respectively, which illustrate different views of the structure and a larger stack of layers than in FIGS. 3A and 3B.

The provided ALE methods compare favorably to wet etching methods because ALE methods have significantly better process control. The amount of etched molybdenum can be reliably controlled by controlling the exposure time to an oxygen-containing reactant in the molybdenum oxidation step, and by controlling the number of etch cycles. In addition, thermal ALE methods have excellent uniformity and do not exhibit pronounced aspect ratio dependent etching (ARDE), which is encountered in RIE. Aspect ratio dependent etching occurs when concentration of the etching species is different at the top and bottom portions of a recessed feature on a substrate, which leads to non-uniform etching at the top and bottom. Thus, provided ALE methods are particularly suitable for etching molybdenum in high aspect ratio features, such as features with aspect ratios of at least about 20:1, at least about 50:1, and at least about 100:1. Since recessed features in 3D NAND structures often have aspect ratios greater than about 5:1, and depths of greater than about 5 nm, provided ALE methods are particularly useful for this application.

Apparatus

The etching methods described herein can be carried out in a variety of apparatuses. A suitable apparatus includes a process chamber, a substrate holder in the process chamber configured to hold the substrate in place during etching, an inlet to the process chamber for introducing one or more reactants and, optionally, a plasma generating mechanism configured for generating a plasma in a process gas (directly in the proximity of the substrate or remotely). In some embodiments, the apparatus does not include any mechanisms for generating a plasma, as provided methods can be performed thermally in an absence of plasma.

Examples of suitable apparatuses include, without limitation, inductively coupled plasma (ICP) reactors which, in certain embodiments, may also be suitable for cyclic deposition and activation processes, including atomic layer deposition (ALD) operations. In some embodiments the apparatus has a process chamber that is used for both deposition of materials and etching using the methods provided herein. For example, in some embodiments the apparatus is configured to deposit molybdenum (e.g., by ALD) and etch molybdenum in the same process chamber. In some embodiments the etch is performed in a Striker® reactor, produced by Lam Research Corp. of Fremont, CA. Although ICP reactors are described herein in detail, it should be understood that capacitively coupled plasma reactors, and reactants without plasma generation equipment may also be used.

Figure 4:
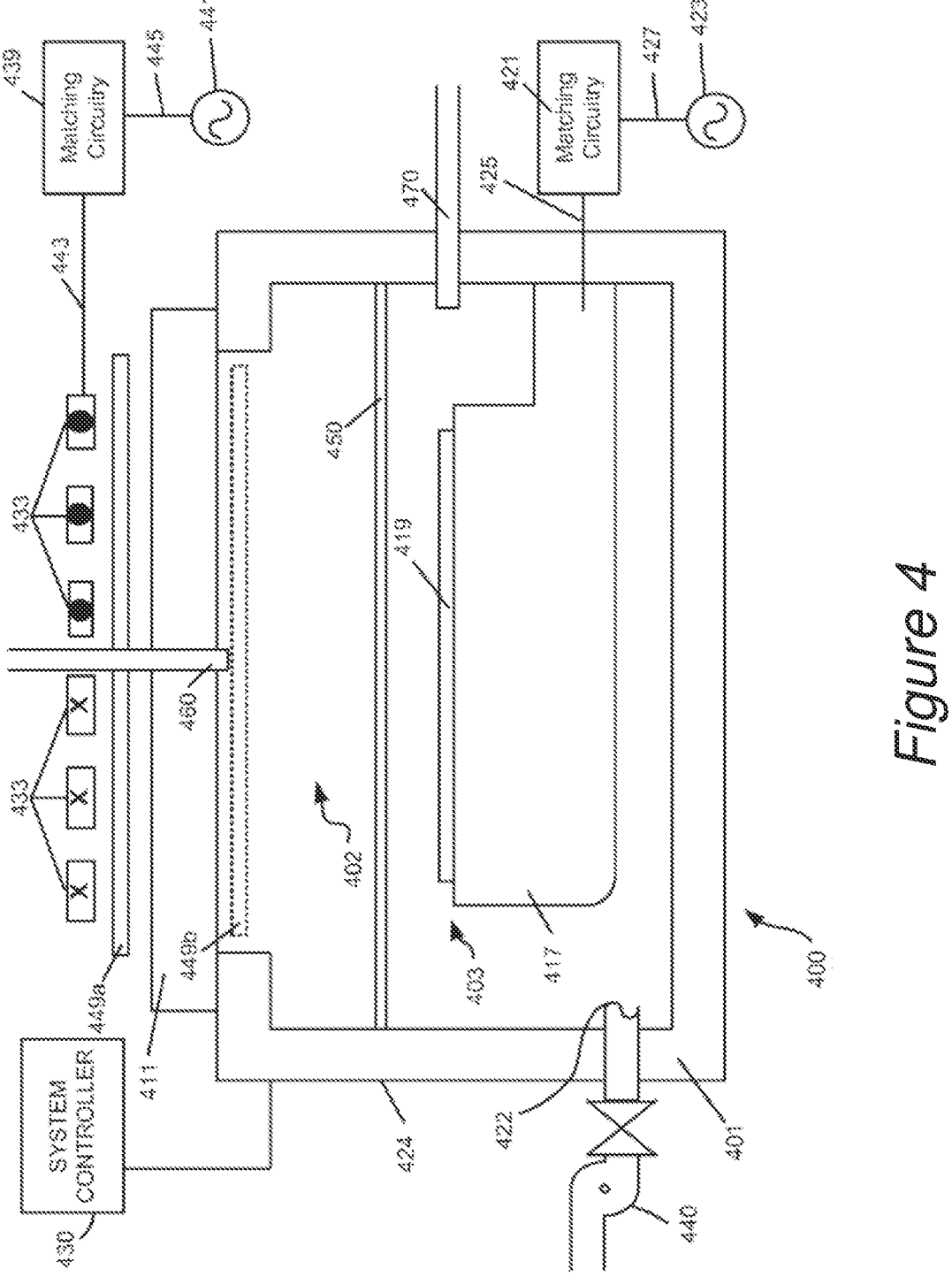
FIG. 4 is a schematic presentation of an apparatus that is suitable for etching molybdenum, according to an embodiment provided herein.

FIG. 4 schematically shows a cross-sectional view of an inductively coupled plasma integrated etching and deposition apparatus 400 appropriate for implementing etching methods described herein, an example of which is a Kiyo® reactor, produced by Lam Research Corp. of Fremont, CA The inductively coupled plasma apparatus 400 includes an overall process chamber 424 structurally defined by chamber walls 401 and a window 411. The chamber walls 401 may be fabricated from stainless steel or aluminum. The window 411 may be fabricated from quartz or other dielectric material. An optional internal plasma grid 450 divides the overall process chamber into an upper sub-chamber 402 and a lower sub-chamber 403. In most embodiments, plasma grid 450 may be removed, thereby utilizing a chamber space made of sub-chambers 402 and 403. A chuck 417 is positioned within the lower sub-chamber 403 near the bottom inner surface. The chuck 417 is configured to receive and hold a semiconductor wafer 419 upon which the etching and deposition processes are performed. The chuck 417 can be an electrostatic chuck for supporting the wafer 419 when present. In some embodiments, an edge ring (not shown) surrounds chuck 417 and has an upper surface that is approximately planar with a top surface of the wafer 419, when present over chuck 417. The chuck 417 also includes electrostatic electrodes for chucking and dechucking the wafer 419. A filter and DC clamp power supply (not shown) may be provided for this purpose. Other control systems for lifting the wafer 419 off the chuck 417 can also be provided. The chuck 417 can be electrically charged using an RF power supply 423. The RF power supply 423 is connected to matching circuitry 421 through a connection 427. The matching circuitry 421 is connected to the chuck 417 through a connection 425. In this manner, the RF power supply 423 is connected to the chuck 417. In various embodiments, a bias voltage of the electrostatic chuck may be set at about 50 Vb or may be set at a different bias voltage depending on the process performed in accordance with disclosed embodiments. For example, the bias voltage may be between about 20 Vb and about 100 Vb, or between about 30 Vb and about 150 Vb.

Elements for plasma generation include a coil 433 is positioned above window 411. In some embodiments, a coil is not used in disclosed embodiments. The coil 433 is fabricated from an electrically conductive material and includes at least one complete turn. The example of a coil 433 shown in FIG. 4 includes three turns. The cross-sections of coil 433 are shown with symbols, and coils having an "X" extend rotationally into the page, while coils having a "•" extend rotationally out of the page. Elements for plasma generation also include an RF power supply 441 configured to supply RF power to the coil 433. In general, the RF power supply 441 is connected to matching circuitry 439 through a connection 445. The matching circuitry 439 is connected to the coil 433 through a connection 443. In this manner, the RF power supply 441 is connected to the coil 433. An optional Faraday shield 449a is positioned between the coil 433 and the window 411. The Faraday shield 449a may be maintained in a spaced apart relationship relative to the coil 433. In some embodiments, the Faraday shield 449a is disposed immediately above the window 411. In some embodiments, the Faraday shield 449b is between the window 411 and the chuck 417. In some embodiments, the Faraday shield 449b is not maintained in a spaced apart relationship relative to the coil 433. For example, the Faraday shield 449b may be directly below the window 411 without a gap. The coil 433, the Faraday shield 449a, and the window 411 are each configured to be substantially parallel to one another. The Faraday shield 449a may prevent metal or other species from depositing on the window 411 of the process chamber 424.

Process gas (e.g. $O_2$) may be flowed into the process chamber through one or more main gas flow inlets 460 positioned in the upper sub-chamber 402 and/or through one or more side gas flow inlets 470. Likewise, though not explicitly shown, similar gas flow inlets may be used to supply process gases to a capacitively coupled plasma processing chamber. A vacuum pump, e.g., a one or two stage mechanical dry pump and/or turbomolecular pump 440, may be used to draw process gases out of the process chamber 424 and to maintain a pressure within the process chamber 424. For example, the vacuum pump may be used to evacuate the lower sub-chamber 403 during a purge operation. A valve-controlled conduit may be used to fluidically connect the vacuum pump to the process chamber 424 so as to selectively control application of the vacuum environment provided by the vacuum pump, thereby controlling the process pressure inside 402 and 403. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 400, one or more process gases such as an $O_2$-containing gas, may be supplied through the gas flow inlets 460 and/or 470. In certain embodiments, process gas may be supplied only through the main gas flow inlet 460, or only through the side gas flow inlet 470. In some cases, the gas flow inlets shown in the figure may be replaced by more complex gas flow inlets, one or more showerheads, for example. The Faraday shield 449a and/or optional grid 450 may include internal channels and holes that allow delivery of process gases to the process chamber 424. Either or both of Faraday shield 449a and optional grid 450 may serve as a showerhead for delivery of process gases. In some embodiments, a liquid vaporization and delivery system may be situated upstream of the process chamber 424, such that once a liquid reactant or precursor is vaporized, the vaporized reactant or precursor is introduced into the process chamber 424 via a gas flow inlet 460 and/or 470.

Radio frequency power is supplied from the RF power supply 441 to the coil 433 to cause an RF current to flow through the coil 433. The RF current flowing through the coil 433 generates an electromagnetic field about the coil 433. The electromagnetic field generates an inductive current within the upper sub-chamber 402. The physical and chemical interactions of various generated ions and radicals with the wafer 419 etch features of and selectively deposit layers on the wafer 419.

If the plasma grid 450 is used such that there is both an upper sub-chamber 402 and a lower sub-chamber 403, the inductive current acts on the gas present in the upper sub-chamber 402 to generate an electron-ion plasma in the upper sub-chamber 402. The optional internal plasma grid 450 limits the amount of hot electrons in the lower sub-chamber 403. In some embodiments, the apparatus 400 is designed and operated such that the plasma present in the lower sub-chamber 403 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 403 through port 422. For example, molybdenum oxychloride generated during etching of molybdenum oxide using $BCl_3$ can be removed through port 422 during purging and/or evacuation. The chuck 417 disclosed herein may operate at temperatures ranging between about 10° C. and about 400° C. The temperature will depend on the process operation and specific recipe. In some embodiments the apparatus is controlled to conduct the etching at a temperature of between about 100-400° C.

Apparatus 400 may be coupled to facilities (not shown) when installed in a clean room or a fabrication facility. Facilities include plumbing that provide processing gases, vacuum, temperature control, and environmental particle control. These facilities are coupled to apparatus 400, when installed in the target fabrication facility. Additionally, apparatus 400 may be coupled to a transfer chamber that allows robotics to transfer semiconductor wafers into and out of apparatus 400 using typical automation.

In some embodiments, a system controller 430 (which may include one or more physical or logical controllers) controls some or all of the operations of a process chamber 424. The system controller 430 may include one or more memory devices and one or more processors. In some embodiments, the apparatus 400 includes a switching system for controlling flow rates of the process gases. The controller, in some embodiments, includes program instructions for causing the steps of any of the methods provided herein.

In some implementations, the system controller 430 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 430, which may control various components or subparts of the system or systems. The system controller, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 430 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 430, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 430 receives instructions in the form of data, which specify parameters for each of the processing steps to be performed during one or more operations. It should be understood that the parameters may be specific to the type of process to be performed and the type of tool that the controller is configured to interface with or control. Thus, as described above, the system controller 430 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 5:
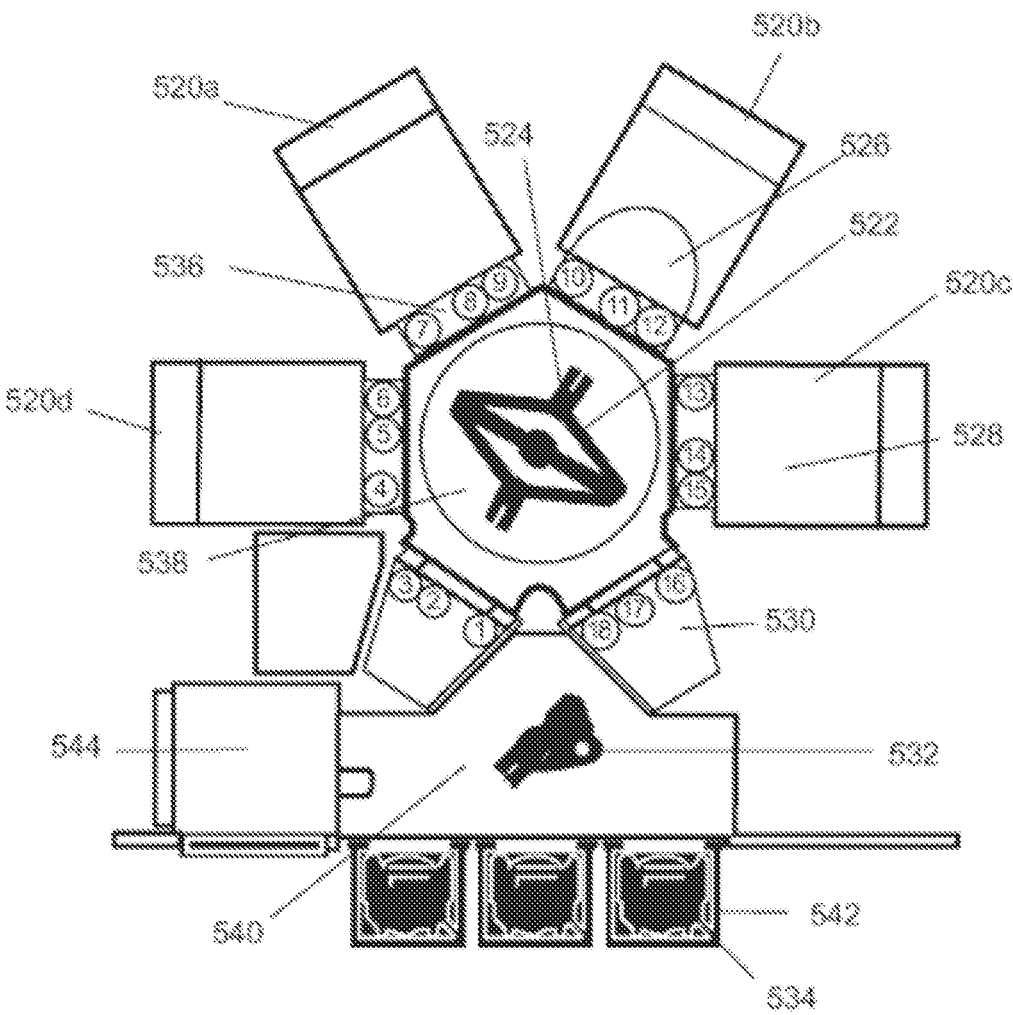
FIG. 5 depicts a semiconductor process cluster architecture, according to an embodiment provided herein.

FIG. 5 depicts a semiconductor process cluster architecture with various modules that interface with a vacuum transfer module 538 (VTM). The arrangement of various modules to "transfer" wafers among multiple storage facilities and processing modules may be referred to as a "cluster tool architecture" system. Airlock 530, also known as a loadlock or transfer module, interfaces with the VTM 538 which, in turn, interfaces with four processing modules 520a-520d, which may be individual optimized to perform various fabrication processes. By way of example, processing modules 520a-520d may be implemented to perform substrate etching, deposition, ion implantation, wafer cleaning, sputtering, and/or other semiconductor processes. In some embodiments, tin oxide deposition and tin oxide etching are performed in the same module. In some embodiments, tin oxide deposition and tin oxide etching are performed in different modules of the same tool. One or more of the substrate etching processing modules (any of 520a-520d) may be implemented as disclosed herein, e.g., for depositing conformal films, selectively etching tin oxide, forming air gaps, and other suitable functions in accordance with the disclosed embodiments. Airlock 530 and processing modules 520a-520d may be referred to as "stations." Each station has a facet 536 that interfaces the station to VTM 538. Inside each facet, sensors 1-18 are used to detect the passing of wafer 526 when moved between respective stations.

Robot 522 transfers wafer 526 between stations. In one embodiment, robot 522 has one arm, and in another embodiment, robot 522 has two arms, where each arm has an end effector 524 to pick wafers such as wafer 526 for transport. Front-end robot 532, in atmospheric transfer module (ATM) 540, is used to transfer wafers 526 from cassette or Front Opening Unified Pod (FOUP) 534 in Load Port Module (LPM) 542 to airlock 530. Module center 528 inside processing modules 520a-520d is one location for placing wafer 526. Aligner 544 in ATM 540 is used to align wafers.

In an exemplary processing method, a wafer is placed in one of the FOUPs 534 in the LPM 542. Front-end robot 532 transfers the wafer from the FOUP 534 to an aligner 544, which allows the wafer 526 to be properly centered before it is etched or processed. After being aligned, the wafer 526 is moved by the front-end robot 532 into an airlock 530. Because the airlock 530 has the ability to match the environment between an ATM 540 and a VTM 538, the wafer 526 is able to move between the two pressure environments without being damaged. From the airlock 530, the wafer 526 is moved by robot 522 through VTM 538 and into one of the processing modules 520a-520d. In order to achieve this wafer movement, the robot 522 uses end effectors 524 on each of its arms. Once the wafer 526 has been processed, it is moved by robot 522 from the processing modules 520a-520d to the airlock 530. From here, the wafer 526 may be moved by the front-end robot 532 to one of the FOUPs 534 or to the aligner 544.

It should be noted that the computer controlling the wafer movement can be local to the cluster architecture or can be located external to the cluster architecture in the manufacturing floor, or in a remote location and connected to the cluster architecture via a network. A controller as described above with respect to FIG. 11 may be implemented with the tool in FIG. 12. Machine-readable media containing instructions for controlling process operations in accordance with the present invention may be coupled to the system controller.

In some embodiments an apparatus is provided, where the apparatus includes a process chamber having a substrate holder configured for holding the semiconductor substrate during etching, and an inlet for introducing one or more reactants to the process chamber; optionally a plasma generator configured for generating a plasma in a process gas; and a controller. The controller includes program instructions for implementing any of the methods describing herein.

In another aspect a non-transitory computer machine-readable medium is provided, where it includes code for causing the performance of any of the methods described herein.

Experimental Results

The effect of process temperature on etch rates was experimentally studied.

Molybdenum was etched on substrates at different temperatures, and the amount of etched material per etch cycle was measured for each temperature. Each cycle included the following steps:

(1) exposure of the substrate to $O_2$ plasma;
(2) process chamber purge with helium:
(3) exposure of the substrate to $BCl_3$ in an absence of plasma;
(4) process chamber purge with helium:
(5) exposure of the substrate to gaseous HF; and
(6) process chamber purge with helium.

Twenty ALE cycles were performed. All cycles were performed at a pressure of 60 mTorr, and at a constant temperature for each tested temperature. Treatment with $O_2$ plasma was performed using direct (in situ) plasma generated using a power of 600 W and frequency of 13.56 MHz. Oxygen was flown into the process chamber at a flow rate of 500 sccm. No external bias was used.

Figure 6:
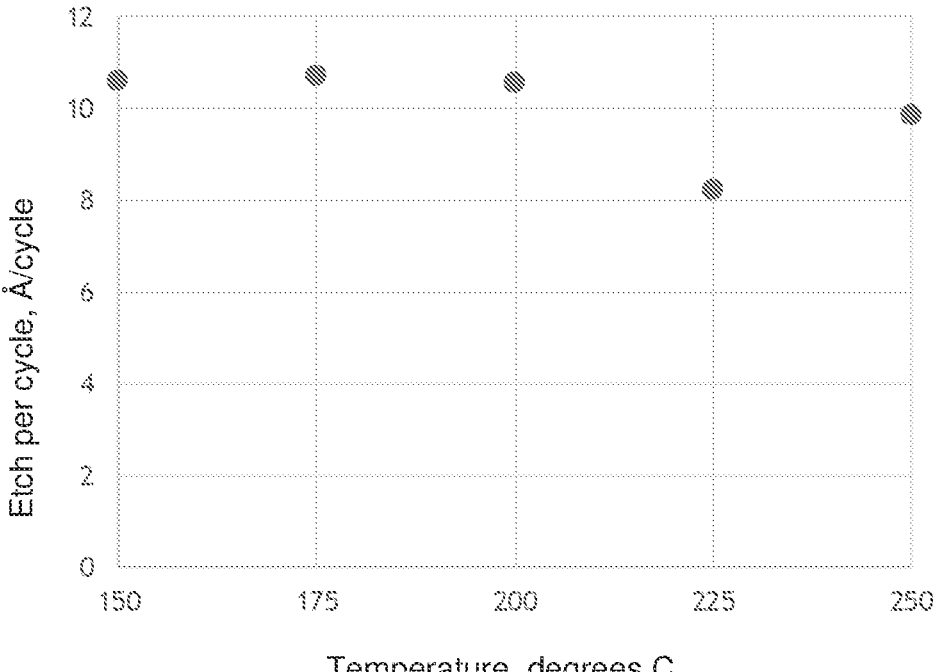
FIG. 6 is an experimental plot illustrating the amount of molybdenum etched per cycle as a function of process temperature.

FIG. 6 is a plot illustrating etch per cycle data for different temperatures in a range of 150-250° obtained using process conditions described above. It can be seen that etch rates of between 8-12 Å/cycle were obtained in this temperature range.

In other experiments it was shown that remotely generated plasma can be used during the oxidation step. When remote plasma was used, plasma was generated using a power of 3,000 W, flow rate of $O_2$ of 1,000 sccm and pressure of 500 mTorr.

Further Implementations

The apparatus and processes described herein may be used in conjunction with lithographic patterning tools or processes, for example, for the fabrication or manufacture of semiconductor devices, displays, LEDs, photovoltaic panels, and the like. Typically, though not necessarily, such apparatus and processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

What is claimed is:

1. A method of etching a molybdenum layer on a semiconductor substrate, the method comprising:
   pre-coating a process chamber for housing a semiconductor substrate with silicon tetrachloride; and
   performing a single etch cycle to controllably remove between about 8 Å to about 15 Å of the molybdenum layer, the single etch cycle comprising:
      (a) exposing the semiconductor substrate to an oxygen-containing reactant to oxidize at least a portion of the molybdenum layer to molybdenum oxide,
      (b) after the molybdenum oxide has formed, exposing the semiconductor substrate to boron trichloride to convert the molybdenum oxide to volatile molybdenum oxychloride while forming boron oxide on the semiconductor substrate, and
      (c) exposing the semiconductor substrate to a fluorine-containing reactant to remove the boron oxide from the semiconductor substrate,
   wherein steps (a)-(c) are performed in an absence of plasma and at a temperature ranging from about 400° C. to about 600° C.

2. The method of claim 1, wherein etching of molybdenum layer by the steps (a)-(c) is isotropic.

3. The method of claim 1, wherein the oxygen-containing reactant is selected from the group consisting of $O_2$ and $O_3$.

4. The method of claim 1, wherein the fluorine-containing reactant is HF.

5. The method of claim 1, wherein the molybdenum layer is etched from sidewalls of a recessed feature on the semiconductor substrate.

6. The method of claim 1, wherein the molybdenum layer is etched during wordline isolation in fabrication of a 3D NAND structure.

7. The method of claim 1, wherein the method comprises performing between about 2-50 etch cycles, and wherein each etch cycle includes the steps (a)-(c).

8. The method of claim 1, wherein the steps (a)-(c) are performed in one process chamber.

9. The method of claim 1, wherein the steps (a)-(c) are performed in one process chamber, and wherein the method further comprises purging the process chamber after each of the steps (a), (b), and (c).

10. The method of claim 1, further comprising the steps of:
   applying photoresist to the semiconductor substrate;
   exposing the photoresist to light;
   patterning the photoresist and transferring the pattern to the semiconductor substrate; and
   selectively removing the photoresist from the semiconductor substrate.

11. The method of claim 1, wherein the oxygen-containing reactant and boron trichloride and fluorine-containing reactant are delivered to a process chamber housing the semiconductor substrate without a carrier gas.

* * * * *